(12) United States Patent
Sheats

(10) Patent No.: US 6,171,765 B1
(45) Date of Patent: Jan. 9, 2001

(54) PHOTOLITHOGRAPHIC PROCESSING FOR POLYMER LEDS WITH REACTIVE METAL CATHODES

(75) Inventor: James R. Sheats, Palo Alto, CA (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/084,607

(22) Filed: May 26, 1998

(51) Int. Cl.$^7$ ........................................................ G03F 7/00
(52) U.S. Cl. .......................... 430/330; 430/314; 430/326
(58) Field of Search ................................ 430/170, 270.1, 430/314, 330, 326

(56) References Cited

U.S. PATENT DOCUMENTS

| | | | |
|---|---|---|---|
| 5,182,188 | * 1/1993 | Cole | 430/323 |
| 5,334,999 | * 8/1994 | Kashiwazaki | 347/65 |
| 5,418,389 | * 5/1995 | Watanabe | 257/295 |
| 5,629,583 | * 5/1997 | Jones | 313/495 |
| 5,843,624 | * 12/1998 | Houlihan | 430/296 |

FOREIGN PATENT DOCUMENTS 0 126 214 A2   11/1984   (EP) .
57-79174   *   5/1982   (JP) .

OTHER PUBLICATIONS

Ito, Hiroshi et al., "Highly Sensitive Thermally Developable Positive Resist Systems", Jouranl of Vacuum Science, B6 (6), Nov./Dec. 1988, pp. 2259–2263.

Frechet, Jean M. J. et al., "New Design for Self–Developing Imaging Systems based on Thermally Labile Polyformals", Chapter 7 Polymers in Microlithography, American Chemical Society, pp. 100–112.

* cited by examiner

Primary Examiner—Martin Angebranndt
Assistant Examiner—Nicole Barreca

(57) ABSTRACT

A method for patterning a layer that includes a material sensitive to water or active hydrogen. The method utilizes a photoresist that includes a photoacid generator and a polymer constructed from fragments that are heat labile when heated to a predetermined temperature, the polymer being stable at the predetermined temperature and soluble in a solvent that does not contain water or active hydrogen. The fragments are joined by acid labile links to form the polymer. The photoacid generator includes a compound that releases acid when exposed to light. In a patterning method according to the present invention, the layer to be patterned is covered with a layer of the photoresist. The regions of the photoresist layer that overlay regions of the patterned layer that are to be removed are exposed to light. The layer of photoresist is then subjected to heating at or above the predetermined temperature to expose the regions of the patterned layer that are to be removed. The portions of the patterned layer that are not covered by photoresist are then removed. Finally, any remaining photoresist is removed by washing in the solvent. The method is well suited to patterning reactive metal layers to form electrodes for multi-colored OLED displays.

10 Claims, 4 Drawing Sheets

PHOTOLITHOGRAPHIC PROCESSING FOR POLYMER LEDS WITH REACTIVE METAL CATHODES

FIELD OF THE INVENTION

The present invention relates to electroluminescent devices, and more particularly, to the patterning of organic light emitting diodes for use in matrix-addressed displays.

BACKGROUND OF THE INVENTION

Organic polymer-based electroluminescent devices (OLEDs) have the potential for providing inexpensive alternatives to alphanumeric displays and x-y addressable displays. A simple OLED may be constructed from an electroluminescent layer sandwiched between an electron injection electrode and a hole injection electrode. More complicated devices utilize electron and hole transport layers between the above mentioned electrodes and the electroluminescent layer. Devices based on poly (p-phenylenevinylene) (PPV), or derivatives thereof, have been demonstrated with sufficient quantum yields to be commercially attractive.

To make a pixelated OLED display, the transparent electrode (usually indium tin oxide, or ITO) is usually patterned into strips running in one direction. After deposition of the organic layers, the final electrode (usually the cathode) is patterned into strips in the orthogonal direction. The cathode is typically constructed from a reactive metal such as Ca or Mg. As a result, the use of standard positive resist techniques is difficult at best. These metals are highly reactive toward water, and also react (though less rapidly) with organic molecules possessing active hydrogens such as alcohols. Since standard photoresist is based on novolak (a phenolic polymer), there is already the potential for significant reaction when the polymer is cast on the metal. Furthermore, the development mechanism of positive resist requires water to be present in the polymer during exposure. This water reaches the metal, and the subsequent reaction degrades the electrode. This situation is further exacerbated during the actual development and rinse steps. If water comes in direct contact with the electrode metal, and if the adhesion of metal to electroluminescent polymer or resist is not of the highest quality, the electrode may be damaged by the undercutting effect as water penetrates into a region that should be protected by resist. Even if the electrode is not lost due to the interaction, some pinholes are likely to be present in the metal. These pinholes allow solvent (and water) from the resist to penetrate directly to the surface of the active organic material.

As a result of these difficulties, the primary patterning technique that has been used to date is a lift-off process. A photoresist mask is formed on the substrate before any active organic layer is deposited, and this mask is used to pattern the metal by interrupting its continuity. While the technique has been successfully used, it has a number of drawbacks. First, it requires either an undercut resist profile, which is more difficult to regularly fabricate, or else an oblique evaporation step for the metal. Second, it is more difficult to use with polymers since the polymer must now be cast over a resist profile that has a tendency to interrupt also the polymer deposition. The polymer may conformally cover the resist features, and then the resist can no longer serve its function of interrupting the metal film. These problems are greatly magnified in three-color displays.

Finally, the standard methods of polymer film coating uniformly cover the entire substrate. In multi-color displays, the polymer must be selectively removed from the pixel areas where the next polymer (emitting a different color) is to be placed. Lift-off processes do not lend themselves to such selective removal.

Techniques based on a conventional negative resist consisting of a photocrosslinkable rubber that does not require water for its action have been demonstrated. However, conventional cross-linking resists of this type are developed by swelling. Both the irradiated and unirradiated regions imbibe developer, but only the unirradiated region dissolves. As a result, the metal is exposed fully to the developer solution. The developer, consisting of 2-ethoxyethanol, penetrates any pinholes in the metal and reacts with the metal or with the active organic electroluminescent material leading to degradation of the electrode. Furthermore, the use of organic solvent for developing results in large quantities of more or less toxic liquid waste. The disposal cost further detracts from the use of this method on a production scale.

Broadly, it is the object of the present invention to provide an improved OLED.

It is a further object of the present invention to provide a photolithographic method for patterning the top electrode of OLEDs that is applicable to multi-color displays.

It is a still further object of the present invention to provide a photolithographic method that does not expose the cathode to water or active hydrogen.

It is a yet further object of the present invention to provide a photolithographic method that does not generate the toxic liquid waste discussed above.

These and other objects of the present invention will become apparent to those skilled in the art from the following detailed description of the invention and the accompanying drawings.

SUMMARY OF THE INVENTION

The present invention is a method for patterning a layer that includes a material sensitive to water or active hydrogen. The method utilizes a photoresist that includes a photoacid generator and a polymer constructed from fragments that are heat labile when heated to a predetermined temperature, the polymer being stable at the predetermined temperature and soluble in a solvent that does not contain water or active hydrogen. The fragments are joined by acid labile links to form the polymer. The photoacid generator includes a compound that releases acid when exposed to light. In a patterning method according to the present invention the layer to be patterned is covered with a layer of the photoresist. The regions of the photoresist layer that overlay regions of the patterned layer that are to be removed are exposed to light. The layer of photoresist is then subjected to heating at or above the predetermined temperature to expose the regions of the patterned layer that are to be removed. The portions of the patterned layer that are not covered by photoresist are then removed. Finally, any remaining photoresist is removed by washing in the solvent. The method is well suited to patterning reactive metal layers to form electrodes for multi- colored OLED displays.

DETAILED DESCRIPTION OF THE INVENTION

Figure 2:
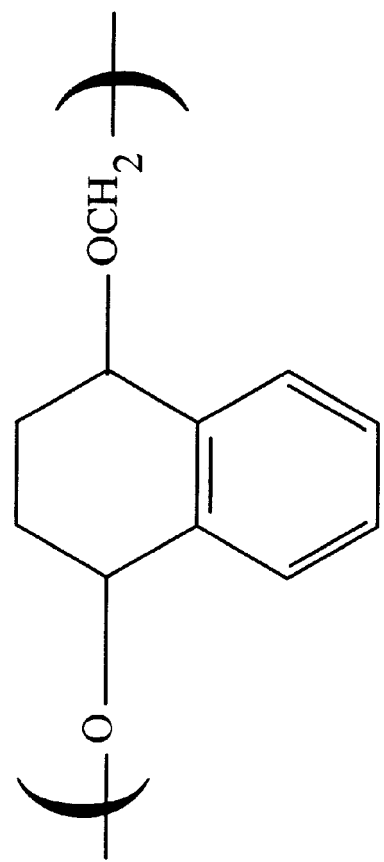
FIG. 2 is the chemical formula for another monomer that may be utilized in constructing a photoresist according to the present invention.

The present invention is based on a class of materials that have been synthesized to be "self-developable" resists. These materials are developed without the use of solvents of any kind. Exposed regions are converted to gaseous products by a thermally-driven reaction. As a result, the only contact of the cathode with organic material is with the resist polymer itself, which can be chosen to be relatively non-reactive, and the solvent used to remove the resist that was not converted to gaseous materials. As will be explained in more detail below, this solvent can also be chosen such that it does, not react with the cathode material.

Once the pattern has been formed, definition of the metal lines can be carried out by several techniques, depending on the metal. For Ca, the preferred etchant is a catalytic amount of acetic acid in methanol (both of which must be rigorously dry). Methanol does not react appreciably with calcium except at the surface, and it does not attack the metal-polymer interface and cause lift-off, as may happen with water. The required amount of acetic acid is less than one percent by weight. This solution allows etching of the calcium in a convenient time (approximately 60 seconds, depending on metal thickness), and does not lead to damage of the nominally protected regions of the pattern. Methanol only penetrates into the resist polymers used in this invention slowly; hence, the metal is protected. This solution is compatible with processing in a glove box or other atmosphere in which water and oxygen have been excluded. These organic vapors may be kept out of a typical oxygen/water scrubber by use of an activated carbon filter.

Although the most common cathode metal is calcium, others such as ytterbium, samarium, or cesium behave similarly. For alloys of lithium and aluminum, standard plasma etching techniques, known in the integrated circuit patterning field may be used. These use chlorine-containing gases to produce volatile aluminum chloride which is desorbed in vacuum. Finally, all metals can be removed by ion milling or $O_2$ plasma.

Other alcohols, such as isopropanol and ethanol and organic acids may be used as well. These substances are chosen to be relatively polar, so that they do not dissolve the resist or penetrate rapidly into it by swelling.

A photoresist according to the present invention is constructed from a polymer having an acid labile link. The fragments of the polymer created by applying acid to break the links must be heat labile so that they can be removed as a gas when heated to a temperature that does not damage the OLED. The polymer is mixed with a photoacid generator, which is a compound that releases acid when exposed to light. The photoresist, which comprises the photoacid generator and polymer, is deposited over the OLED. The coated areas that are to be exposed are illuminated with light which causes the photoacid generator to release acid, thereby (with heat) breaking the polymer bonds in the exposed area. Preferred photoacid generators include triphenylsulfonium trifluoromethanesulfonate and triphenylsulfonium hexafluoroantimonate. Irradiation with a mercury lamp promotes the formation of triflic acid which attacks the bonds of the polymer. The coated device is then heated to drive off the fragments created by the acid attack on the polymer. After the subsequent processing steps are completed, the photoresist mask is removed by washing the device with a solvent that does not contain water or active hydrogens.

Figure 1:
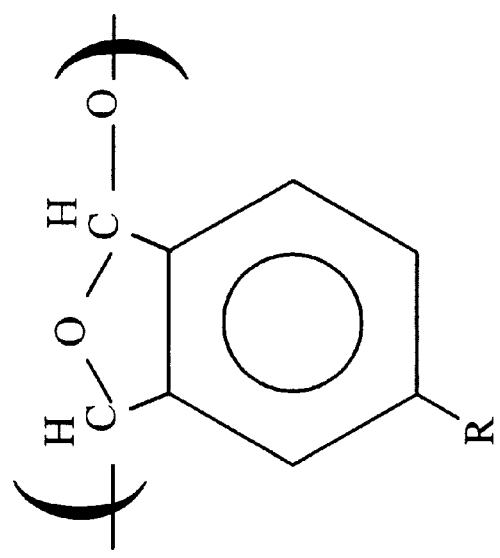
FIG. 1 is the chemical formula for a class of monomers that may be utilized in constructing a photoresist according to the present invention.
Figure 3:
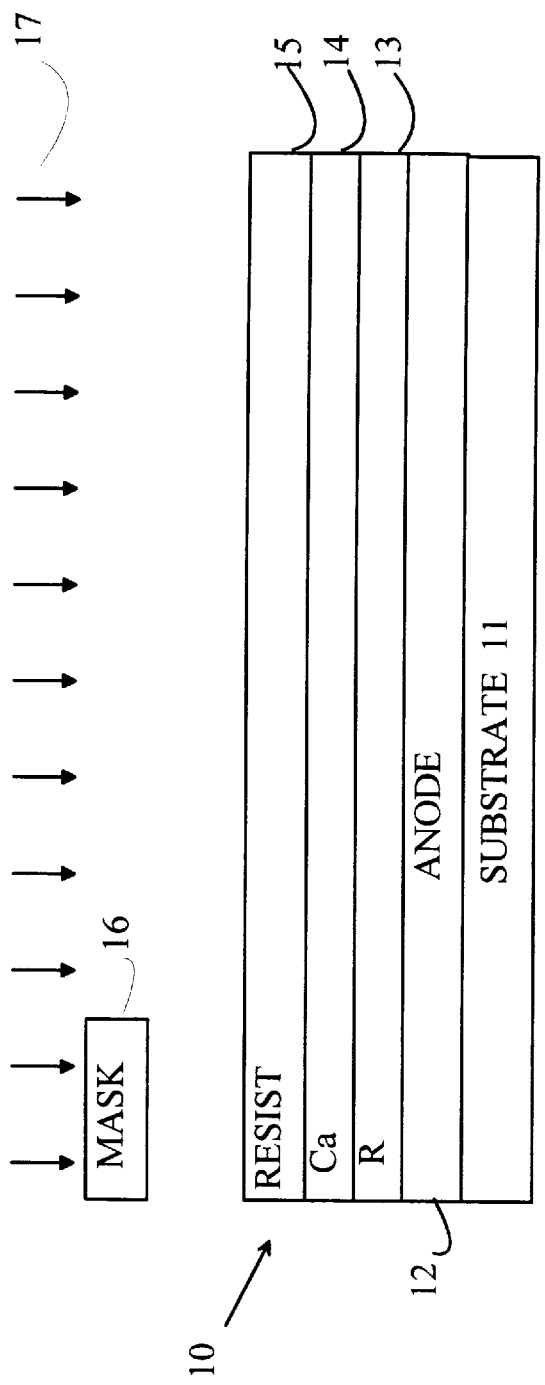
FIGS. 3–8 are cross-sectional views of a portion of a multi-color display at exemplary stages in the fabrication of that display.

A number of acid labile polymers are known to the art. Refer to FIG. 1 which is the general formula for the monomer of a class of polymers that may be utilized with the present invention. The cases in which R is Cl or Br correspond to Poly(4-chlorophthalaldehyde) and poly(4-bromophthalaldehyde), respectively. Both compounds have decomposition temperatures of 200° C. The compounds are developed by heating at 100° C. for 1 min. after an exposure at 5 mJ/cm$^2$ with 1.2 wt. % loading of a photoacid generator. The undeveloped polymer regions may be removed with cyclohexanone. A detailed discussion of these compounds may be found in H. Ito, et al., *J. Vac. Sci Technol. B* 6, 2259 (1988) and H. Ito and R. Schwalm, *J Electrochem. Soc.* 136,241 (1989) which are hereby incorporated by reference.

If R=SiMe$_3$, Poly(4-trimethylsilylphthalaldehyde) is obtained. Compounds of this class having Si are resistant to exposure to oxygen and reactive ion etching. This compound is stable to 230° C. but develops completely on baking for 1 min. at 100° C. after 4 mJ/cm$^2$ irradiation with 1.2 w/t % loading of photoacid generator. The undeveloped polymer may also be removed with cyclohexanone. This compound is discussed in detail in H. Ito et al., *J Electrochem. Soc.* 136,245 (1989).

Another exemplary polymer is shown in FIG. 2 which is the chemical formula for the monomer for Poly (1-oxy4-oxymethylene-1,2,3,4-tetrahydronaphthalene). This compound is stable to 250° C., and develops fully on baking at 65° C. after exposure to 12 mJ/cm$^2$ with 10 wt. % loading of photoacid generator. The undeveloped polymer is soluble in cyclohexanone. This compound is described in detail in J. M. J. Frechet, et al., in *Polymers in Microlithography (ACS Syrnp. Ser.* 412), E. Reichmanis, S. A. MacDonald, and T. Iwayanagi, ed. (Amer. Chem. Soc., 1989), p.100 which is hereby incorporated by reference.

A number of photoacid generators are known in the art. Two compounds which are especially suited to this invention are triphenylsulfonium trifluoromethanesulfonate and triphenylsulfonium hexafluoroantimonate. Other acid generators may be used as well, as described for example by C. G. Willson in Introduction to Microlithography, L. F. Thompson, C. G. Willson and M. J. Bowden, ed. (Amer. Chem. Soc., 1994), p. 217. These include, among others, diaryliodonium salts, ortho-nitrobenzyl esters, and phloroglucinol sulfonates.

The manner in which a resist according to the present invention is utilized in constructing a RBG multi-color OLED display can be more easily understood with reference to FIGS. 3–8 which are cross-sectional views of a portion of a multi-color display 10 at various stages in the fabrication process. Initially, an anode layer is deposited on a substrate 11. The anode layer is typically indium tin oxide. The anode layer is patterned to form strips in one direction. The cross-sectional views shown in these figures are taken through one of these strips. Anode 12 is then covered by an organic polymer layer 13 that emits in the red region of the spectrum (for example, by doping a polymer with a red-emitting dye). Organic polymer layer 13 is then covered by a Ca layer 14 and a layer of photoresist 15 according to the present invention. Photoresist layer 15 is then exposed to a light source 17. A mask 16 is used to protect the regions that are to become the red emitting pixels.

Figure 4:
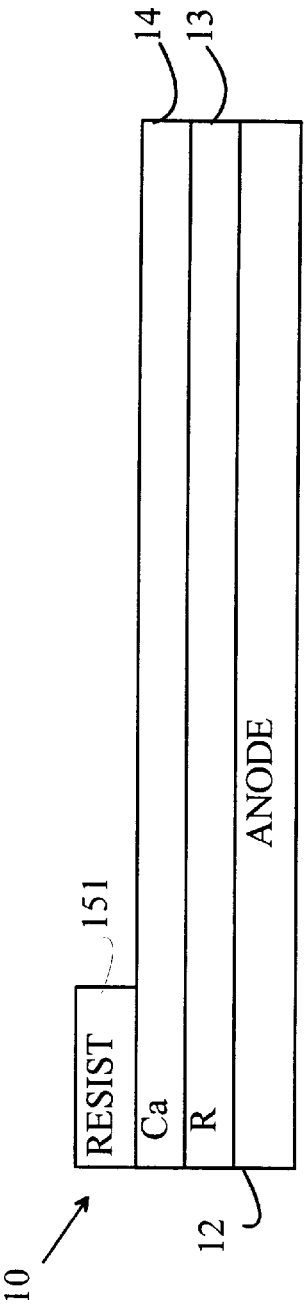

The device is then heated to develop the photoresist layer leaving an island 151 of photoresist over each of the regions that are to become red emitting pixels as shown in FIG. 4.

Figure 5:
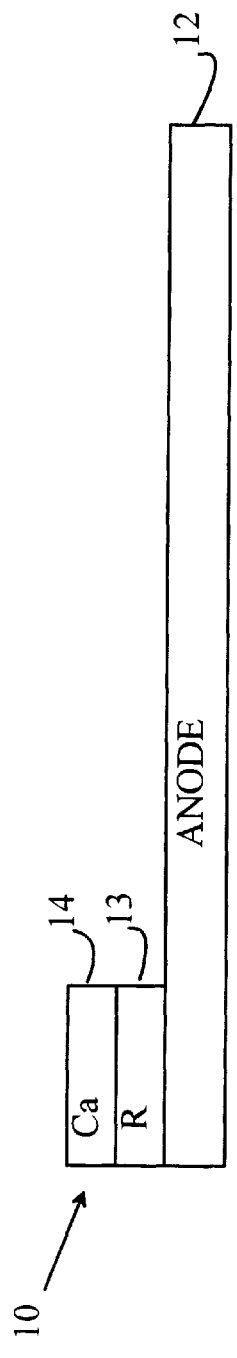

These islands are typically strips that are perpendicular to the anode strips discussed above. The Ca and polymer layers are then etched back to the anode layer. The Ca layer may be etched by any of the methods described above. The polymer layer is then etched by a reactive ion etch using oxygen which stops on the anode. After the photoresist islands 151 have been removed by treatment with the appropriate solvent, the red emitting pixels are left on the anode as shown in FIG. 5.

Figure 6:
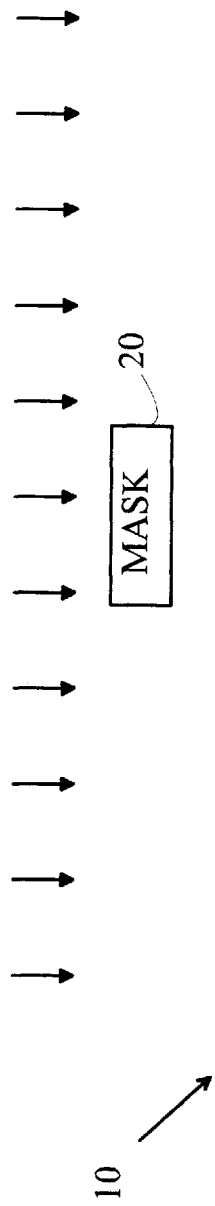

The process is then repeated for the green emitting pixels. Referring to FIG. 6, a layer 17 of polymer that emits in the green region of the spectrum is deposited over the display. A layer 18 of Ca is then deposited over the polymer layer, and a layer 19 of photoresist is deposited on the Ca layer.

Figure 7:
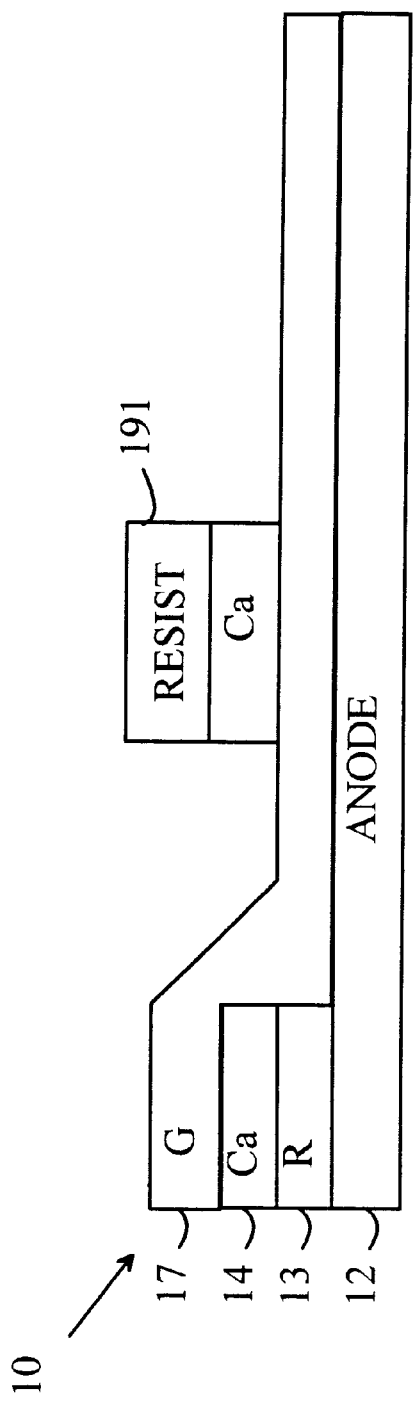
Figure 8:
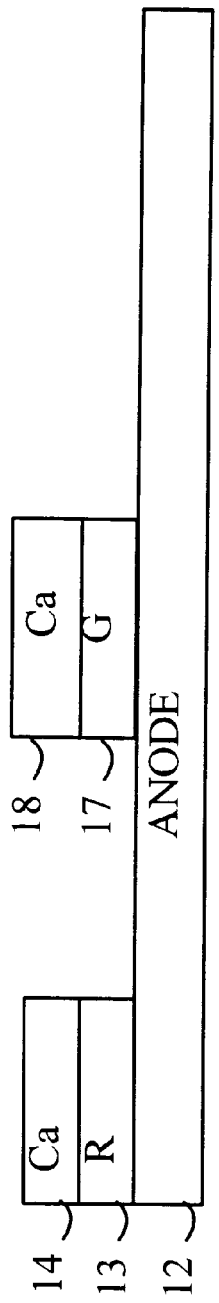

The photoresist is then exposed to a light source with the regions that are to become the green emitting pixels masked by a mask 20. The photoresist is then developed by heating, which leaves an island of photoresist over each of the pixels that is to become a green emitter. The Ca is then removed in the unprotected area by the application of an appropriate etchant, which leaves the device as shown in FIG. 7. The polymer layer is then etched using an oxygen reactive ion etching. The reactive ion etch stops on Ca or the anode material. The photoresist islands are then removed leaving the device as shown in FIG. 8.

The process for the blue emitting pixels is the same as that described above with the exception that a blue emitting polymer is used in place of the green emitting polymer. Hence, this step will not be described further.

The oxygen reactive ion etching used to remove the polymers leaves the top surface of the remaining metal in an oxidized state. Therefore, a brief reducing treatment, such as exposure to hydrogen, may be advantageous when making external contacts.

The above-described embodiments of the present invention have utilized specific examples of polymers constructed from fragments that are thermally labile. This class of polymers is known to those skilled in the art as "thermally-developable polymers". A more detailed discussion of such polymers together with other examples of such polymers may be found in the above-mentioned C. G. Willson, *Introduction to Microlithography, pp.* 219–223.

Various modifications to the present invention will become apparent to those skilled in the art from the foregoing description and accompanying drawings. Accordingly, the present invention is to be limited solely by the scope of the following claims.

What is claimed is:

1. A method for patterning a layer, said method comprising the steps of:

covering said layer to be patterned with a layer of a photoresist comprising a photoacid generator and a polymer constructed from fragments that are converted to gaseous products when heated to a predetermined temperature, said polymer being stable at said predetermined temperature, said fragments being joined by acid labile links to form said polymer, said polymer being soluble in a solvent that does not contain water or active hydrogen, and said photoacid generator comprising a compound that releases acid when exposed to light said layer to be patterned comprising a material that reacts chemically to water or active hydrogen;

exposing regions of said photoresist that overlay regions of said layer to be patterned that are to be removed to light;

heating said layer of photoresist to a temperature to remove the exposed regions of said photoresist at or above said predetermined temperature;

removing portions of said layer to be patterned in regions not covered by said photoresist; and removing any remaining photoresist by washing in said solvent.

2. The method of claim 1 wherein said photoacid generator comprises one of triphenylsulfonium trifluoromethanesulfonate and triphenylsulfonium hexafluoroantimonate.

3. The method of claim 1 wherein said fragments comprise:

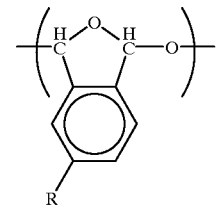

4. The method of claim 3 wherein R is chosen from the group consisting of Cl, Br, and SiMe$_3$.

5. The method of claim 1 wherein said fragments comprise 1-oxy-4-oxymethylene-1,2,3,4-tetrahydronaphthalene.

6. The method of claim 1 wherein said step of removing portions of said layer to be patterned comprises exposing said portions of said layer to an O$_2$ plasma.

7. The method of claim 1 wherein said step of removing portions of said layer to be patterned comprises exposing said portions of said layer to an alcohol and an organic acid.

8. The method of claim 7 wherein said alcohol is isopropanol, ethanol or methanol.

9. The method of claim 7 wherein said organic acid is acetic acid.

10. The method of claim 1 wherein said step of removing portions of said layer to be patterned comprises exposing said portions of said layer to ion milling.

* * * * *